United States Patent
Okamoto et al.

(10) Patent No.: US 6,423,958 B1
(45) Date of Patent: Jul. 23, 2002

(54) SOLID STATE IMAGING DEVICE AND METHOD OF DRIVING THE SAME

(75) Inventors: Seishi Okamoto; Takashi Miida, both of Kanagawa (JP)

(73) Assignee: Innotech Corporation (JP)

( * ) Notice: Subject to any disclaimer, the term of this patent is extended or adjusted under 35 U.S.C. 154(b) by 0 days.

(21) Appl. No.: 09/562,010

(22) Filed: May 2, 2000

(30) Foreign Application Priority Data

Feb. 18, 2000 (JP) .......................................... 12-040923
Apr. 12, 2000 (JP) .......................................... 12-111140

(51) Int. Cl.[7] .............................................. H01L 27/00
(52) U.S. Cl. ..................................... 250/208.1; 348/294
(58) Field of Search ....................... 250/208.1; 348/294, 348/297, 311; 257/291, 298, 304, 305; 358/513, 514

(56) References Cited

U.S. PATENT DOCUMENTS 5,365,097 A * 11/1994 Kenney ...................... 257/302
6,020,581 A * 2/2000 Dennard et al. ......... 250/208.1

* cited by examiner

*Primary Examiner*—David P. Porta
*Assistant Examiner*—Robert H. Kim
(74) *Attorney, Agent, or Firm*—Lorusso & Loud

(57) ABSTRACT

The solid state imaging device comprises a solid state imaging element for storing light generating charges in a high concentration buried layer under a channel, modulating a threshold voltage, and detecting a light signal, a signal output circuit 105 for outputting a difference voltage between a first source potential after light modulation and a second source potential before the light modulation, wherein the signal output circuit 105 stores the first source potential and the second source potential in a first line memory (Lms) and a second line memory (Lmn) each formed of an input capacitor which is connected to a source region of a light signal detecting insulated gate field effect transistor respectively and outputs a difference voltage (Vout=VoutS−VoutN) between the first source potential and the second source potential via switched capacitor circuits.

24 Claims, 13 Drawing Sheets

Channel Width Direction

Channel Length Direction

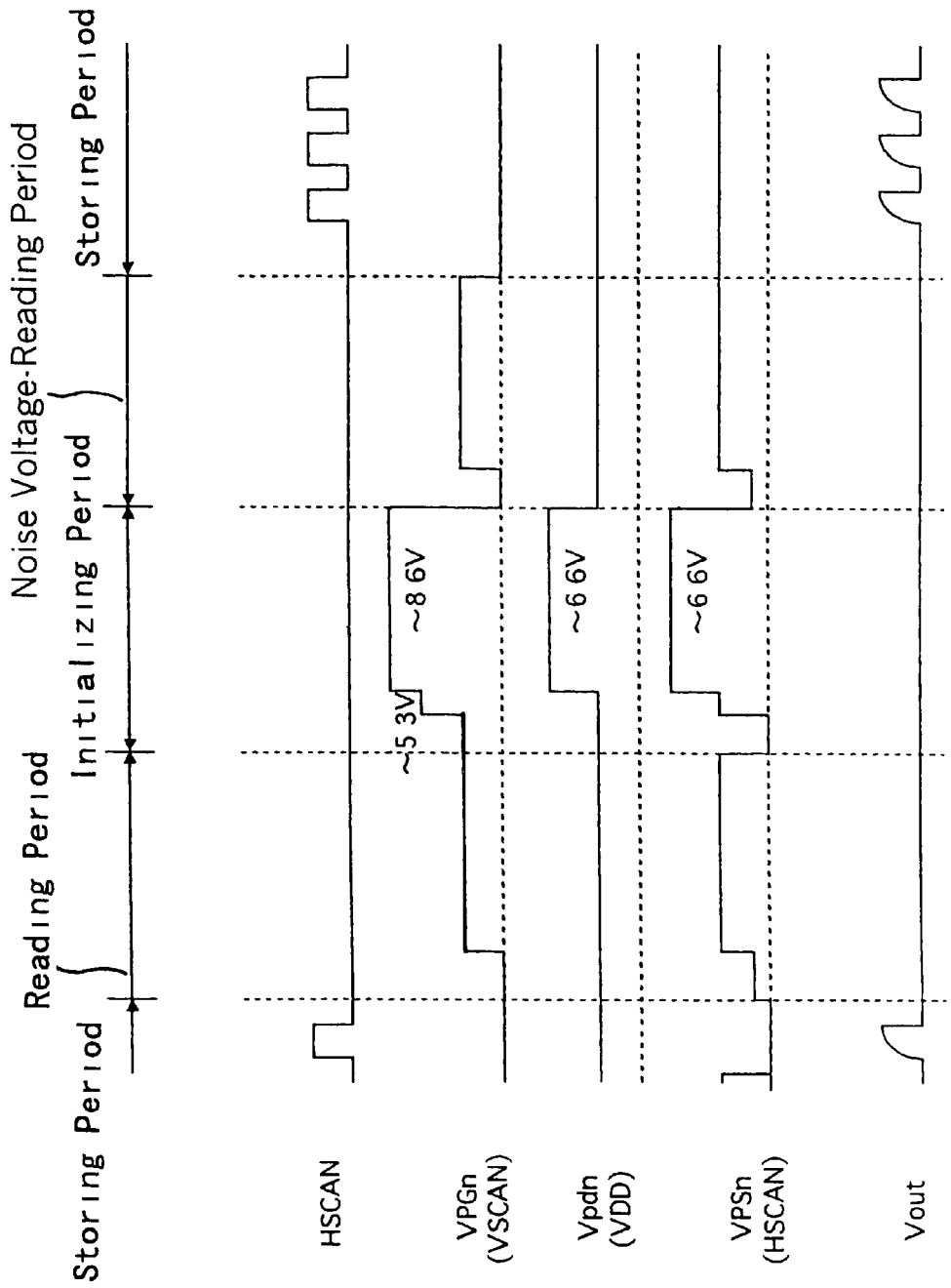

Channel Width Direction

Channel Length Direction

SOLID STATE IMAGING DEVICE AND METHOD OF DRIVING THE SAME

BACKGROUND OF THE INVENTION

1. Field of the Invention

The present invention relates to a solid state imaging device employing a MOS image sensor of a threshold voltage modulation system, which is employed in a video camera, an electronic camera, an image input camera, a scanner, a facsimile, or the like, and a method of driving. the same.

2. Description of the Related Art

Since semiconductor image sensors such as a CCD image sensor, a MOS image sensor, etc. are excellent in mass productivity, they are applied to most image input devices with the development of pattern miniaturizing technology.

In particular, the MOS image sensor is looked at once again in recent years because such MOS image sensor has smaller power consumption than the CCD image sensor and also the sensor device and its peripheral circuit devices can be fabricated by the same CMOS technology.

In light of such tendency of society, inventors of the present invention improved the MOS image sensor, then filed a Patent Application (Patent Application Hei 10-186453) in connection with the sensor device that has a carrier pocket (high concentration buried layer) under a channel region, and then obtained a Patent (registration number 2935492).

This MOS image sensor has a circuit configuration shown in FIG. 1A of this application, and takes an initializing period, a storing period, and a reading period in operation, as shown in FIG. 1B. In the initializing period, the channel region is brought into the depletion state by applying a high reverse voltage to electrodes to discharge light generating holes that remain in a hole pocket. In the storing period, the light generating holes are generated by the light irradiation and stored into the hole pocket. In the reading period, a light signal that is in proportion to a storage amount of the light generating holes is detected.

In the invention according to the Patent (registration number 2935492), as shown in FIGS. 1A, 1B of this application, a signal impedance is reduced by a source follower using the combination of a light signal detecting MOS transistor 312 and an active load such as a constant current source 306, etc. provided on the outside, a source potential is detected, a memory capacity (not shown) is charged, and a voltage signal is output.

200 of the other reference symbols is a vertical output line, 201 a VSCAN supply line, 202 a VDD supply line, 206 a horizontal output line, 301 a unit pixel, 302 a VSCAN drive scanning circuit, 303 a VDD drive scanning circuit, 304 an input scanning circuit, 305 a switch, 307 an output terminal, and 311 a photo diode. The detail description for the circuit configuration and the operation may refer to the Patent (registration number 2935492).

However, when wiring widths are reduced since pixels are miniaturized, parasitic resistance values are increased. Thus, variation in voltage drop in the wirings and between the wirings due to series resistance becomes an issue.

Therefore, when a current value is reduced in order to suppress the voltage drop, a rate of occupying a sub-threshold current (characteristic immediately before the leading of the drain current in the drain voltage-drain current characteristic) to a source current due to the drain-induced barrier lowering (DIBL) is increased relatively if a channel length is short. Therefore, since an output voltage is put under the control of the sub-threshold current, variation in modulation of the output voltage is increased.

SUMMARY OF THE INVENTION

It is an object of the present invention to provide a solid state imaging device which is capable of suppressing the influence of variation in a sub-threshold current and reducing variation in modulation of an output voltage, and a method of driving the same.

According to the present invention, the light signal detecting insulated gate field effect transistor in the pixel is the threshold-modulated type light signal detecting insulated gate field effect transistor which is provided with the high concentration buried layer under a channel and which accumulates light generating charges under the channel is employed, therefore a channel length thereof is long.

For this reason, the electric fields from the drain regions are relaxed. Hence, the threshold variation is made small and in turn variation in the sub-threshold current is made small, therefore the charging current can be minimized. As a result, since potential reduction due to the parasitic resistance such as the wiring, etc. can be suppressed, the direct coupling with the capacitive load can be attained.

Also, a finite time is needed to load line memories. But the loading time into the line memories is considerably shorter than the noise voltage-reading period and the reading period. Therefore, the loading into the line memories can be finished in the noise voltage-reading period, or the like.

By the way, if a plurality of line memories are aligned in parallel, these parasitic capacitances are connected in parallel with the line memories to be read, and the first and second source potentials stored in the line memories to be read are output via the so-called switched capacitor circuit. At this time, since the charge transfer is caused in the switched capacitor circuit by the first operational amplifier, the parasitic capacitance viewed from the output side of the switched capacitor circuit can be reduced. Thus, a reading speed is seldom affected even if a plurality of line memories are aligned in parallel. Also, such advantage can be achieved that, since the influence of the parasitic capacitance is small, the maximum gain can be obtained.

In addition, the preset voltage which is higher than a ground potential but lower than the stored source potential can be stored in the first line memory and the second line memory prior to storage of the source potential by connecting a means for applying a preset voltage to the first line memory and the second line memory. Accordingly, an operation of the light signal detecting insulated gate field effect transistor can be cut off without fail while the ground potential is being applied to the gate electrode of the light signal detecting insulated gate field effect transistor, whereby a leakage current can be minimized.

The transmission gates formed of the CMOS transistors are used as the first switch circuit and second switch circuit, and thus a higher signal voltage can be passed through the transmission gate. In this case, when a higher voltage is applied to the source region of the light signal detecting insulated gate field effect transistor, the transmission gates come not to work normally by the reason why the pn junction of the source/drain region in the p channel MOS transistor of CMOS transistors constituting the transmission gate is biased to a forward direction.

In order to avoid this, a high voltage blocking switch circuit is provided on the vertical output line between the first switch circuit and the second switch circuit and the source region of the light signal detecting insulated gate field effect transistor. Or a first high voltage blocking switch circuit is provided between the first switch circuit and the source region, and a second high voltage blocking switch circuit is provided between the second switch circuit and the source region. Accordingly, the above trouble can be prevented by cutting a connection between the first switch circuit and the source region and a connection between the second switch circuit and the source region during an initializing period when a high voltage is applied to the source region in order to sweep out the charges stored in the high concentration buried layer.

BRIEF DESCRIPTION OF THE DRAWINGS

FIG. 4 is a timing chart in operating the solid state imaging device in FIG. 2 and FIG. 3;

DESCRIPTION OF THE PREFERRED EMBODIMENT

A few embodiments of the present invention will be explained with reference to the accompanying drawings hereinafter.

(First Embodiment)

Figure 12:
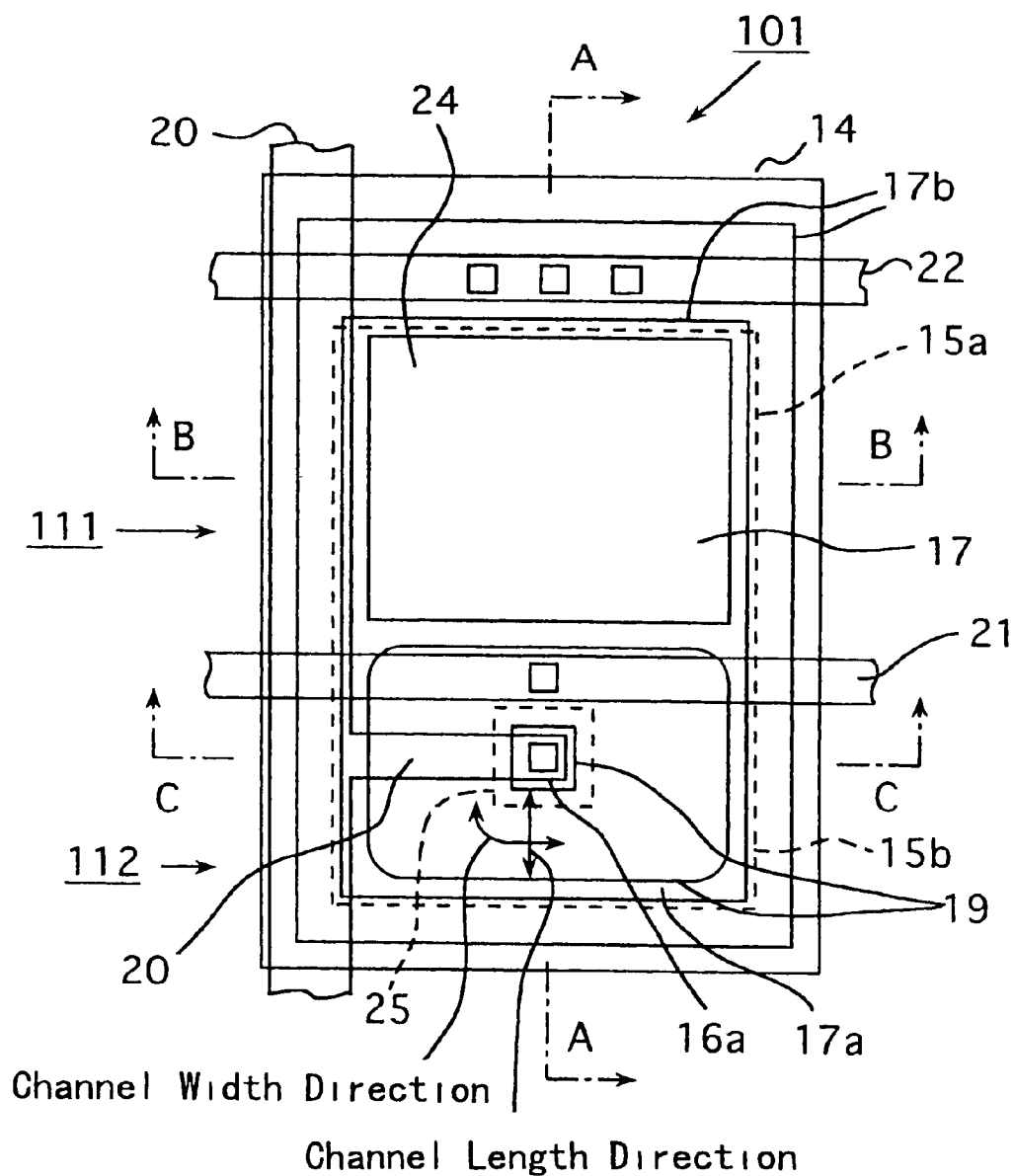
FIG. 12 is a plan view showing an element layout in a unit pixel of a solid state imaging element employed in the solid state imaging device according to the embodiment of the present invention.

FIG. 12 is a plan view showing an element layout in a unit pixel of a MOS image sensor according to the first embodiment of the present invention.

As shown in FIG. 12, a photo diode 111 and a light signal detecting MOS transistor 112 are provided adjacently in a unit pixel 101. As the MOS transistor 112, an n-channel MOS (nMOS) having a low concentration drain structure (LDD structure) is employed.

The photo diode 111 and a light signal detecting MOS transistor 112 are formed on different well regions, i.e., a first well region 15a and a second well region 15b respectively. These well regions 15a, 15b are connected mutually. The first well region 15a of the photo diode 111 portion constitutes a part of a charge generating region by the light irradiation. The second well region 15b of the MOS transistor 112 portion constitutes a gate region which can change a channel threshold voltage by a potential applied to this well region 15b.

The MOS transistor 112 portion has a low concentration drain (LDD) structure. Drain regions 17a, 17b are formed to surround an outer peripheral portion of a ring-like gate electrode 19. A source region 16 is formed in an inner area of the ring-like gate electrode 19.

The low concentration drain region 17a is extended, and the impurity region 17 of the photo diode 111, which has the almost same impurity concentration as the low concentration drain region 17a, is formed. That is, the impurity region 17 and the low concentration drain region 17a are formed integrally such that their regions are mostly located on surface layers of the first well region 15a and the second well region 15b which are connected mutually. Also, a high concentration drain region 17b is formed as a contact layer on outer side peripheral portions of the impurity region 17 and the low concentration drain region 17a such that it is connected to the low concentration. drain region 17a while avoiding the light receiving portion.

In addition, a carrier pocket (high concentration buried layer) 25, which is a feature of this MOS image sensor, is formed in the second well region 15b below the gate electrode 19 and around the source region 16 to surround the source region 16.

The drain regions 17a, 17b are connected to a drain voltage (VDD) supply line (or drain electrode) 22 through a low resistance contact layer 17b. The gate electrode 19 is connected to a vertical scanning signal (VSCAN) supply line 21. The source region 16 is connected to a vertical output line (or source electrode) 20.

The above elements are covered with an insulating film 33. Regions of the photo diode 111 other than a light receiving window 24 are light-shielded by a metal layer (light shielding film) 23 formed on the insulating layer 33.

In an element operation of the above MOS image sensor to detect the light signal, a series of processes consisting of a storing period, a reading period, and an initializing period (a sweeping-out period) are repeated like the storing period-the reading period-the initializing period (sweeping-out period)-the storing period . . . . In this embodiment, a noise voltage-reading period is provided.

In the storing period, carriers are generated by the light irradiation, and then holes of the carriers are transferred through the first well region 15a and the second well region 15b and stored in the carrier pocket 25. A positive voltage of about +2 to 3 V is applied to the drain regions 17a, 17b, and a small positive or negative voltage which can keep a cut-off state of the MOS transistor 112 is applied to the gate electrode 19. The storing period is also a period during when a voltage difference between a first source potential, which is modulated by a light signal and stored in a first line memory, and a second source potential, which is obtained in the state of initializing and stored in a second line memory, is output to the video signal output terminal 107 via the horizontal line 26.

In the reading period, change in the threshold voltage of the MOS transistor 112 because of the light generating charges stored in the carrier pocket 25 is read as change in the source potential, and then stored in the first line memory. The positive voltage of about +2 to 3 V is applied to the drain regions 17a, 17b and the positive voltage of about +2 to 3 V is applied to the gate electrode 19, so that the MOS transistor 112 can be operated in its saturation state.

In the initializing period, before the light generating charges (light generating carriers) are stored, the light generating charges, acceptors, donors, etc. remained after the reading has been finished are neutralized, otherwise remaining charges prior to the reading of the light signal, e.g., holes, electrons, etc. trapped at the surface level are discharged to empty the carrier pocket 25. The positive high voltage in excess of about +5V, normally about 7 to 8 V, is applied to the source region 16, the drain regions 17a, 17b, and the gate electrode 19.

The noise voltage-reading period is between the initializing period and the storing period. During this period, the second source potential obtained in the condition that the light generating charges have been swept out from the carrier pocket 25 is stored in the second line memory.

Next, a device structure of the MOS image sensor according to the embodiment of the present invention will be explained with reference to a sectional view hereunder.

Figure 13A:
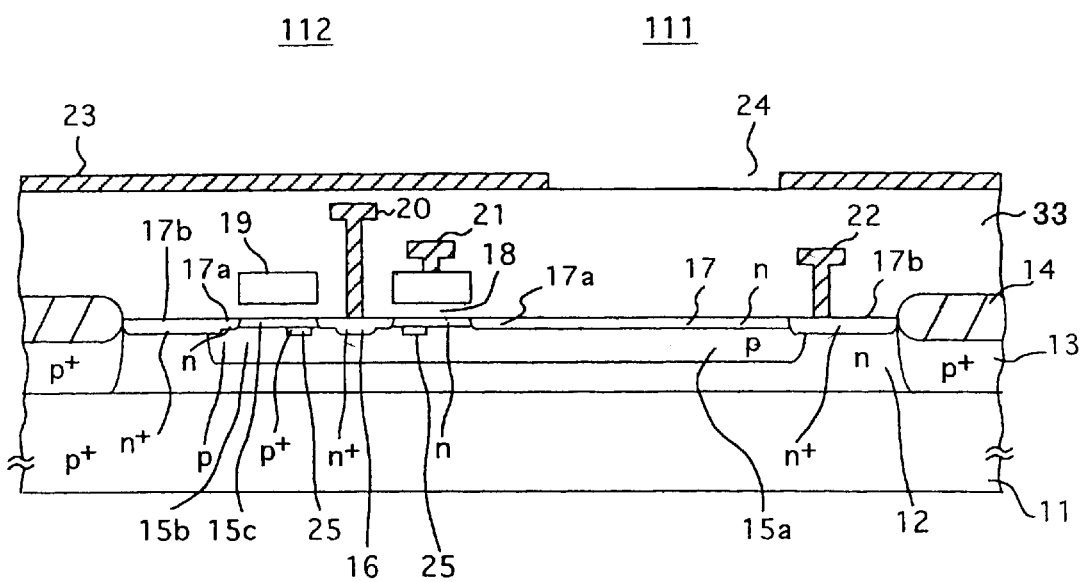
FIG. 13A shows a device structure, taken along an A—A line in FIG. 12, in the unit pixel of the solid state imaging element employed in the solid state imaging device according to the embodiment of the present invention.
Figure 13B:
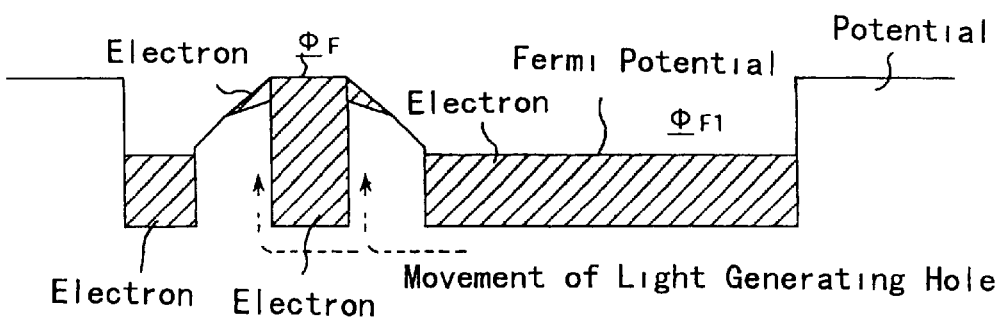
FIG. 13B is a view showing a behavior of potential in the state where light generating holes are accumulated in carrier pockets and then electrons are induced in a channel region to generate electron-accumulated areas.

FIG. 13A is a sectional view showing the device structure of the MOS image sensor according to the embodiment of the present invention, which corresponds to a sectional view taken along an A—A line in FIG. 12. FIG. 13B is a view showing a behavior of potential along a surface of the semiconductor substrate.

As shown in FIG. 13A, an epitaxial layer 12 is formed by epitaxially growing n-type silicon, whose impurity concentration is about $1 \times 10^{15}$ cm$^{-3}$, on a substrate 11 formed of p-type silicon whose impurity concentration is in excess of $1 \times 10^{18}$ cm$^{-3}$.

A plurality of unit pixels each containing the photo diode 111 and the light signal detecting MOS transistor 112 are formed in the epitaxial layer 12. Then, in order to isolate respective unit pixels 101, a field insulating film (device isolation insulating film) 14 is formed by the selective oxidation (LOCOS) on a surface of the epitaxial layer 12 between adjacent unit pixels 101. Then, a p-type device isolation region 13 is formed below the field insulating film 14 and on the substrate 11 so as to contain an overall interface between an epitaxial layer 12 and the field insulating film 14 and isolate the n-type epitaxial layer 12.

Next, details of the photo diode 111 will be explained with reference to FIG. 13A.

The photo diode 111 comprises the epitaxial layer 12, the p-type first well region 15a formed on a surface layer of the epitaxial layer 12, and the n-type impurity region 17 extending from the surface layer of the first well region 15a to the surface layer of the epitaxial layer 12.

The impurity region 17 is formed to extend from the low concentration drain region 17a of the light signal detecting MOS transistor 112 which has the low concentration drain (LDD) structure.

In the storing period mentioned above, the impurity region 17 is connected to a drain voltage supply line 22 and is biased to the positive potential. At this time, a depletion layer is extended from the interface between the impurity region 17 and the first well region 15a to an overall area of the first well region 15a to reach the n-type epitaxial layer 12. Also, a depletion layer is extended from the interface between the substrate 11 and the epitaxial layer 12 to reach the first well region 15a.

Since the first well region 15a and the epitaxial layer 12 are connected to the gate region 15b of the MOS transistor 112, these holes generated by the light can be used effectively as the charges for modulating the threshold voltage of the MOS transistor 112. In other words, the first well region 15a and the epitaxial layer 12 can serve as a whole as the carrier generating region by the light.

In view of the respect that the carrier generating region by the light is arranged below the impurity region 17 in the above photo diode 111, such photo diode 111 has a buried structure for holes generated by the light. Accordingly, the noise reduction can be achieved without the influence of the semiconductor layer surface which has many trap levels.

Next, details of the light signal detecting MOS transistor 112 will be explained with reference to FIG. 13A hereunder.

The MOS transistor 112 portion comprises the p-type substrate 11, the n-type epitaxial layer 12 formed on the substrate 11, and the p-type second well region 15b formed in the epitaxial layer 12 in the order from the bottom.

This MOS transistor 112 has a structure in which an outer periphery of the ring-like gate electrode 19 is surrounded by the n-type low concentration drain region 17a. This n-type low concentration drain region 17a is formed integrally with the n-type impurity region 17. The high concentration drain region 17b which is connected to the impurity region 17 to extend up to the device isolation region 13 and the field insulating film 14 is formed on the outer peripheral portion of the impurity region 17 that extends from the low concentration drain region 17a. The high concentration drain region 17b serves as a contact layer of a drain electrode 22.

Also, an n-type source region 16 is formed to be surrounded by the ring-like gate electrode 19. The source region 16 has the high concentration at its center portion and the low concentration at its peripheral portion. The source electrode 20 is connected to the source region 16.

The gate electrode 19 is formed on the second well region 15b between the drain region 17a and the source region 16 via a gate insulating film 18. A surface layer of the second well region 15b below the gate electrode 19 acts as a channel region. In addition, in order to hold the channel region in its electron-accumulated state or its depletion state at the normal operating voltage, a channel-doped layer 15c is formed by introducing the n-type impurity of appropriate concentration into the channel region.

A p$^+$-type carrier pocket (high concentration buried layer) 25 is formed in a part of the second well region 15b below the channel region in the channel length direction, i.e., around the source region 16 to surround the source region 16. This p$^+$-type carrier pocket 25 can be formed by the ion implantation method, for example. The carrier pocket 25 is formed in the second well region 15b which is lower than the channel region formed on the surface. It is preferable that the carrier pocket 25 should be formed not to overlap with the channel region.

Since the potential of the light generating holes out of the light generating charges becomes low in the above p$^+$-type carrier pocket 25, the light generating holes can be concentrated into the carrier pocket 25 when a voltage higher than the gate voltage is applied to the drain regions 17a, 17b.

The potential diagram in the state the light generating holes are accumulated in the carrier pocket 25 and electrons are induced in the channel region to then generate the electron-accumulated region is shown in FIG. 13B. The threshold voltage of the MOS transistor 112 is changed by this storage charges. Therefore, the light signal can be detected by detecting change in the threshold voltage.

In the meanwhile, in the above initializing period of the carriers, the carriers remained in the second well region 15b are swept out to the substrate 11 side by the electric field generated by applying the high voltage to the gate electrode 19. In this case, because of the applied voltage, the depletion layer is extended from the interface surface between the channel-doped layer 15c in the channel region and the second well region 15b into the second well region 15b and also the depletion layer is extended from the interface surface between the p-type substrate 11 and the epitaxial layer 12 into the epitaxial layer 12 below the second well region 15b. Accordingly, the range of the electric field generated by the voltage applied to the gate electrode 19 can mainly extend to the second well region 15b and the epitaxial layer 12 below the second well region 15b.

Figure 1A:
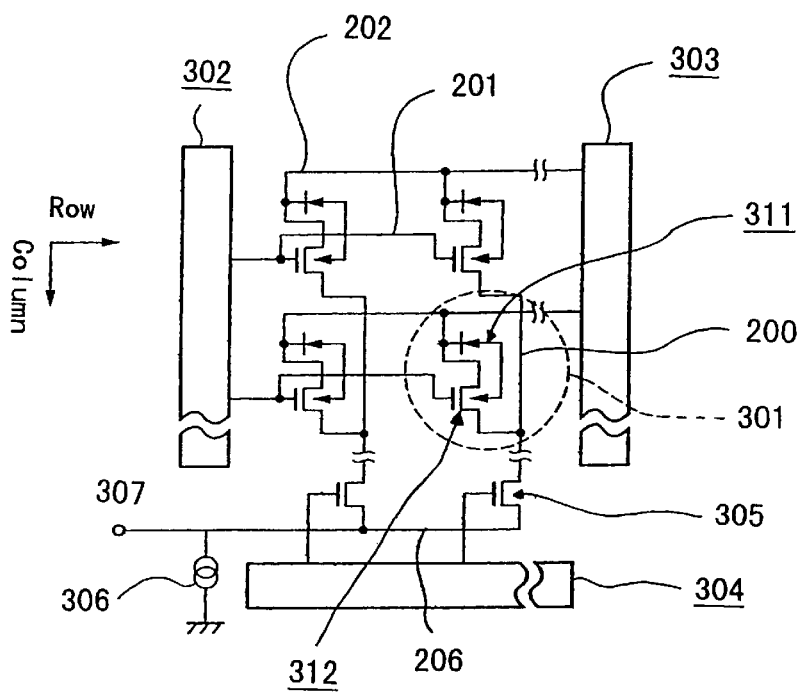
FIG. 1A is a view showing an overall circuit configuration of a solid state imaging device in the related art.
Figure 1B:
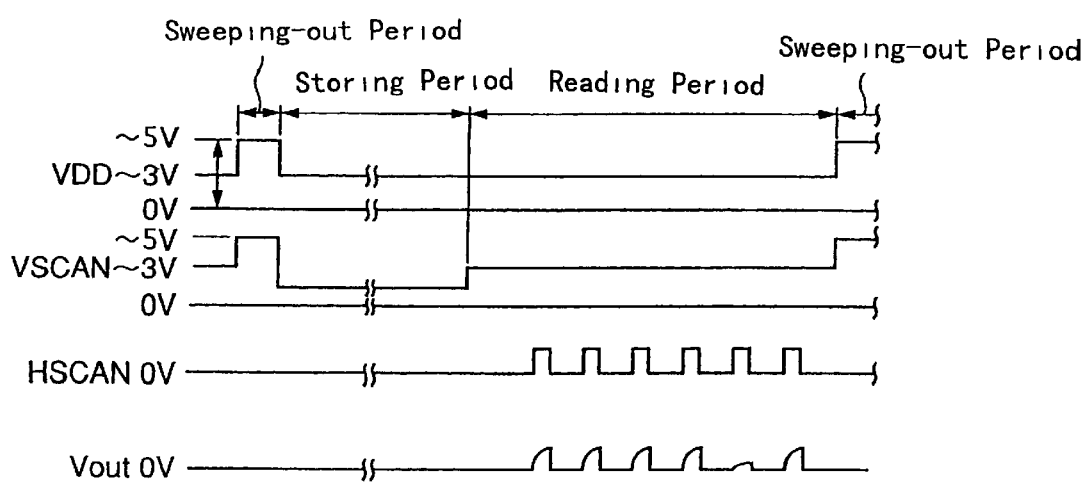
FIG. 1B is a timing chart employed in operating the solid state imaging device in FIG. 1A.
Figure 2:
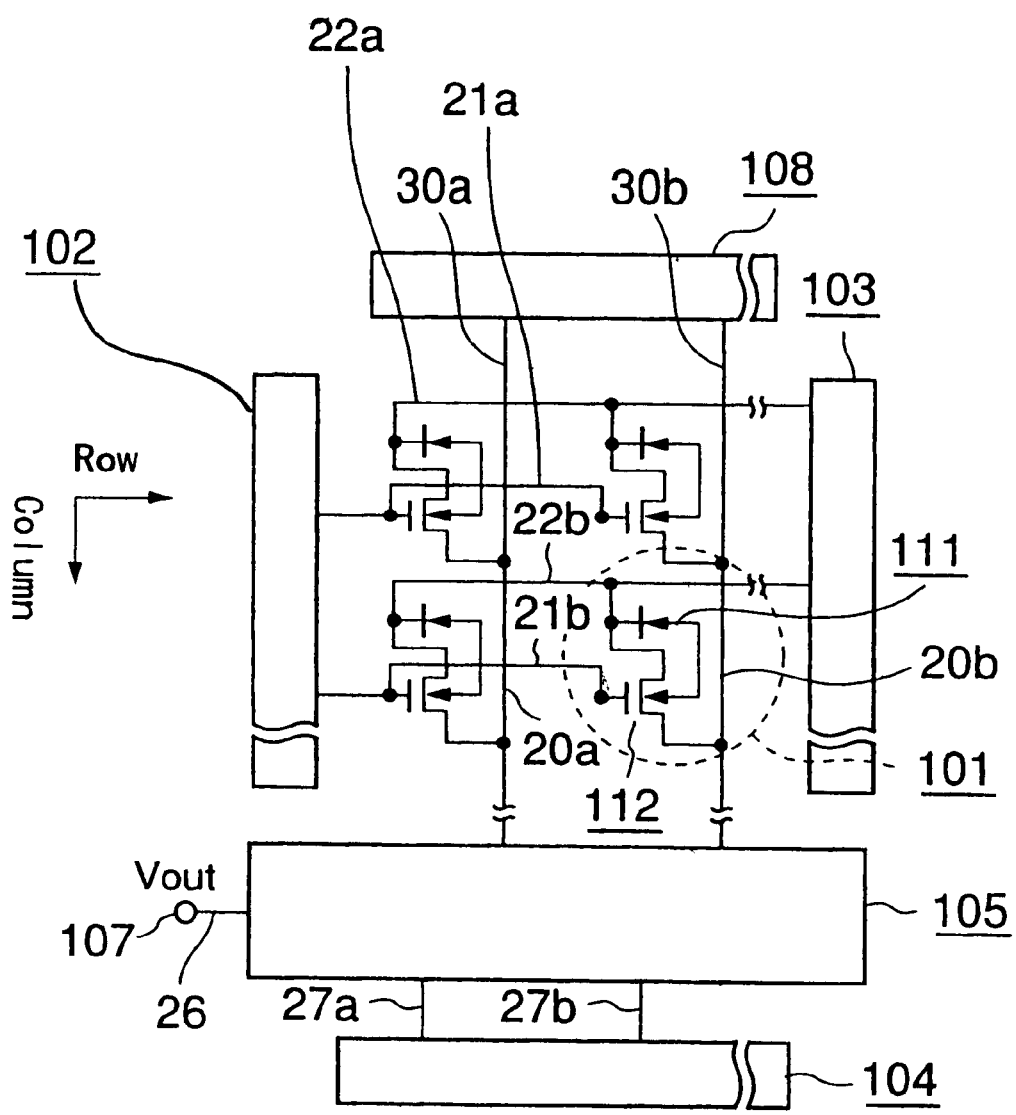
FIG. 2 is a view showing an overall circuit configuration of a solid state imaging device according to a first embodiment of the present invention.

Then, an overall structure of the MOS image sensor employing the unit pixel having the above structure will be explained with reference to FIG. 2 hereunder. FIG. 2 is a view showing a circuit configuration of the MOS image sensor according to the embodiment of the present invention.

As shown in FIG. 2, this MOS image sensor employs a two-dimensional array sensor configuration, and the unit pixels 101 each having the above structure are arranged in the row direction and the column direction like a matrix fashion.

Also, the vertical scanning signal (VSCAN) drive scanning circuit 102 and the drain voltage (VDD) drive scanning circuit 103 are arranged laterally to put the pixel region therebetween.

Vertical scanning signal supply lines 21a, 21b are output one by one every row from the vertical scanning signal (VSCAN) drive scanning circuit 102. Respective vertical scanning signal supply lines 21a, 21b are connected to the gate of the MOS transistor 112 in all unit pixels 101 which are arranged along the row direction.

In addition, drain voltage supply lines (VDD supply lines) 22a, 22b are output one by one every row from the drain voltage (VDD) drive scanning circuit 103. Respective drain voltage supply lines (VDD supply lines) 22a, 22b are connected to the drain of the light signal detecting MOS transistor 112 in all unit pixels 101 which are arranged along the row direction.

Also, different vertical output lines 20a, 20b are provided every column. Respective vertical output lines 20a, 20b are connected to the source of the MOS transistor 112 in all unit pixels 101 which are arranged along the column direction.

Figure 3:
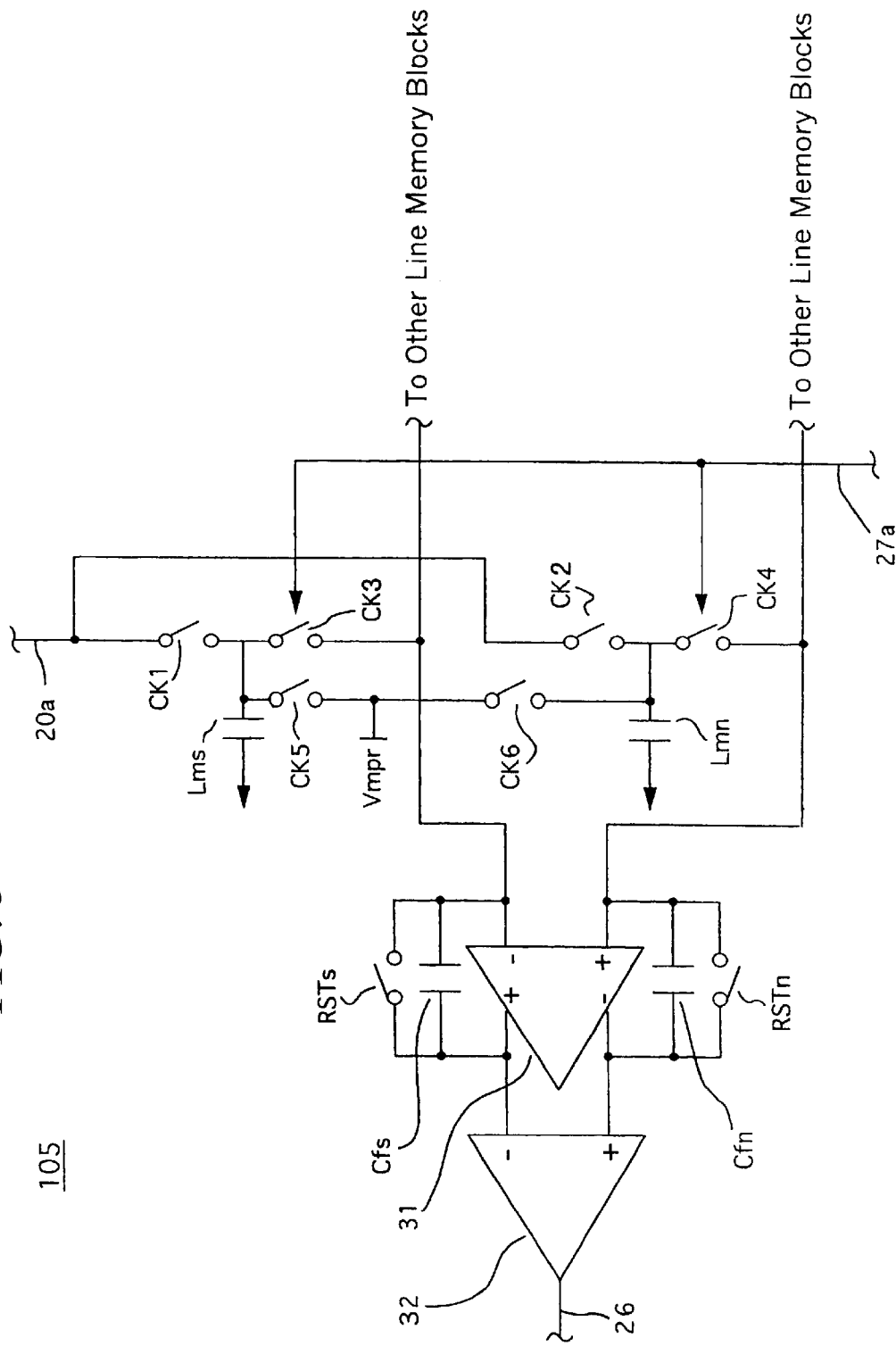
FIG. 3 is a view showing a detailed configuration of a signal output circuit in FIG. 2.

Furthermore, the source region of the MOS transistor 112 is connected to a signal output circuit 105 via vertical output lines every column. Then, as shown in FIG. 3, the source region is directly connected to the line memory consisting of an input capacitor in the above signal output circuit 105. The MOS image sensor has such a feature that the active load such as a constant current source, etc. is not connected to the source region.

A video signal (Vout), which is in proportion to an amount of incident light and does not contain the noise component due to the residual charge, is read from the signal output circuit 105 by driving sequentially the MOS transistors 112 of respective unit pixels 101 by using the vertical scanning signal (VSCAN) and the horizontal scanning signal (HSCAN).

Details of the above signal output circuit 105 are shown in FIG. 3 hereunder. As shown in FIG. 3, a vertical output line 20a which is connected to the source region of the light signal detecting MOS transistors 112 is branched, one of which is connected via a first switch circuit CK1 to one terminal of a first line memory lms which stores the first source potential containing the light signal voltage and the noise voltage due to the residual charges prior to the storage of the light generating charges, and the other is connected via a second switch circuit CK2 to one terminal of a second line memory Lmn which stores on, the above noise voltage.

Also, one terminal of the first line memory Lms is also connected to a negative input terminal of a first operational amplifier 31 via a third switch circuit CK3 which is controlled via the HSCAN supply line 27a. One terminal of the second line memory Lmn is also connected to a positive input terminal of the first operational amplifier 31 via a fourth switch circuit CK4 which is controlled via the HSCAN supply line 27a.

In addition, a circuit for applying a preset voltage Vmpr to the first line memory Lms and the second line memory Lmn is provided. The preset voltage Vmpr is connected to the first line memory Lms via a fifth switch circuit CK5, and also is connected to the second line memory Lmn via a sixth circuit CK6. Accordingly, since the preset voltage which is higher than a ground potential but lower than the stored source potential can be stored in the first line memory Lms and the second line memory Lmn prior to storage of the source potential representing noise signal and light signal, an operation of the light signal detecting insulated gate field effect transistor 112 can be cut off without fail while the ground potential is being applied to the gate electrode 19 of the light signal detecting insulated gate field effect transistor 112, whereby a leakage current can be minimized.

There is provided every column with a line memory block comprising the first and second line memories Lms, Lmn and the first to sixth switches CK1 to CK6.

A positive output terminal of the first operational amplifier 31 is connected to a negative input terminal of a second operational amplifier 32, and a negative output terminal of the first operational amplifier 31 is connected to a positive input terminal of the second operational amplifier 32. An output terminal of the second operational amplifier 32 is connected to a video signal output terminal 107 via the horizontal output line 26.

A feedback capacitor Cfs and a reset switch circuit RSTs are connected in parallel between the negative input terminal and the positive output terminal of the first operational amplifier 31. A feedback capacitor Cfn and a reset switch circuit RSTn are connected in parallel between the positive input terminal and the negative output terminal of the first operational amplifier 31.

The first and third switch circuits CK1, CK3 and the first line memory Lms, a portion of the first operational amplifier 31 to which the feedback capacitor Cfs and the reset switch circuit RSTs are connected, the second operational amplifier 32 constitute a first switched capacitor circuit. Also, the second and fourth switch circuits CK2, CK4 and the second line memory Lmn, a portion of the first operational amplifier 31 to which the feedback capacitor Cfn and the reset switch circuit RSTn are connected, the second operational amplifier 32 constitute a second switched capacitor circuit. The reset switch circuits RSTs and RSTn are closed when charges stored in the feedback capacitor Cfs and Cfn are removed.

The switch circuits (CK1 to CK6, RSTs, RSTn) in the signal output circuit 105 are shown schematically in the form of FIG. 3 to indicate functionally open/close of these wirings. Actually, the n-channel MOS transistors, etc. are employed singly or in combination as these switch circuits so as to perform appropriately the circuit operations explained in this embodiment.

In this embodiment, the first operational amplifier 31 is used commonly in the first and second switched capacitor circuits. Thus, an advantage of reducing the common mode noise can be achieved, but separate operational amplifiers may be provided as the case may be. In this case, the separate operational amplifiers have the positive and negative input terminals respectively, but the line memory is connected to the negative input terminal out of the positive and negative input terminals of respective operational amplifiers and the positive input terminal is set to the ground potential.

Also, a step-up scanning circuit 108 is provided, and respective step-up voltage output lines 30a, 30b from the step-up scanning circuit 108 are connected to the vertical output lines 20a, 20b. In other words, a step-up voltage is applied to the source region of the MOS transistor 112 of each unit pixel 101 every column. The step-up voltage is further applied to the gate consequently via a gate-source capacitance. As a result, the electric field strength applied to the well region is increased and thus the sweeping-out of the carriers can be accelerated.

Figure 5A:
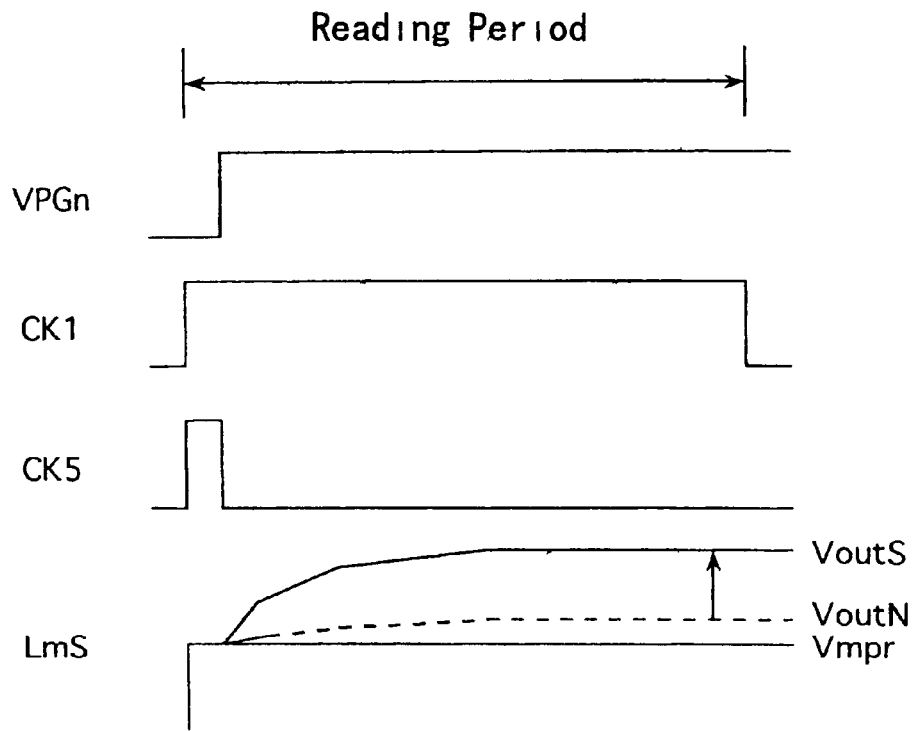
FIG. 5A is a timing chart in the reading period in operating the solid state imaging device in FIG. 3.
Figure 5B:
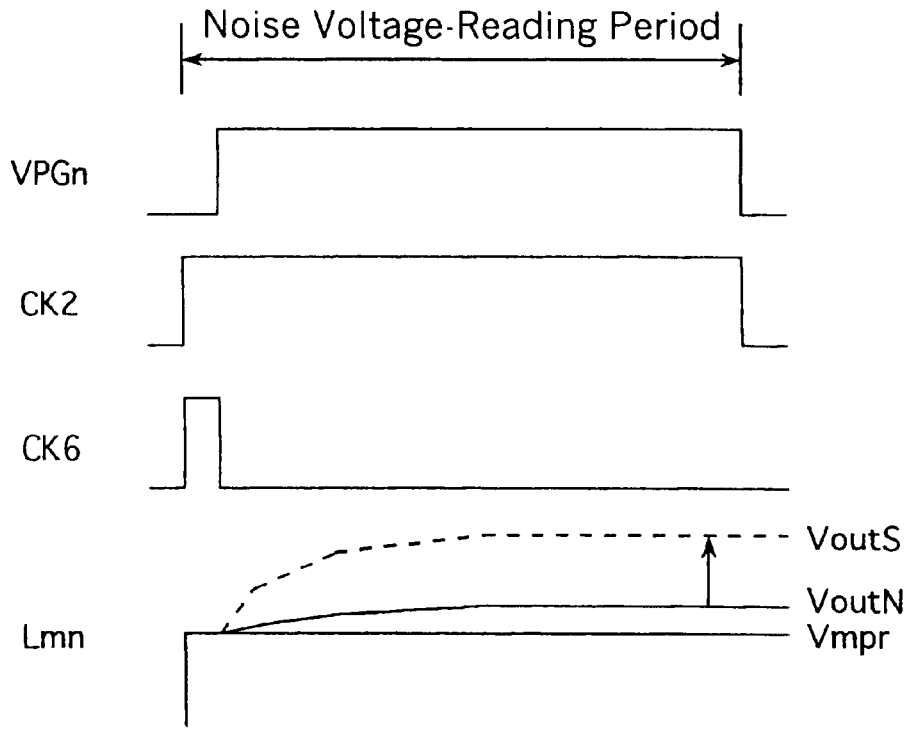
FIG. 5B is a timing chart in the noise voltage-reading period.

FIG. 4 shows a timing chart of input/output signals to operate the MOS image sensor according to the present invention. FIGS. 5A and 5B show timing charts of input/output signals in the signal output circuit 105 to operate the MOS image sensor according to the present invention. In this case, the p-type first and second well regions 15a, 15b are employed and applied to the case where the light signal detecting MOS transistor 112 is composed of nMOS.

Next, a series of successive light detecting operations of the solid state imaging device will be explained simply with reference to FIG. 4, FIGS. 5A and 5B. As described above, the light detecting operations perform repeatedly a series of processes consisting of the storing period-the reading period-the sweeping-out period (initializing period). For convenience' sake, the explanation will be started from the reading period herein.

First, in the storing period, the low gate voltage is applied to the gate electrode 19 of the light signal detecting MOS transistor 112 and also the voltage (VDD) of about 2 to 3 V, which is necessary for the operation of the transistor, is applied to the drain regions 17a, 17b. At this time, the first well region 15a, the second well region 15b, and the epitaxial layer 12 are depleted. Thus, the electric field which is directed from the drain regions 17a, 17b to the source region 16 is generated.

Then, in the storing period prior to the reading period, the output terminal of the step-up scanning circuit 108 is set to the ground potential (the source potential of the MOS transistor 112). At this time, the output terminal of the VSCAN drive scanning circuit 102 is set to the ground potential (the gate potential of the MOS transistor 112), and the output (Vpdn) of the VDD drive scanning circuit 103 is set to about 3.3 V.

In turn, electron-hole pairs (light generating charges) are generated by irradiating the light to the photo diode 111.

The light generating holes out of the light generating charges are injected into the gate region 15b of the light signal detecting MOS transistor 112 by the above electric field, and then accumulated in the carrier pocket 25. Therefore, the width of the depletion layer which spreads from the channel region to the gate region 15b below the channel region is restricted, and the potential near the source region 16 is modulated and thus the threshold voltage of the MOS transistor 112 is changed.

In the storing period, the difference voltage between source potentials stored in the line memories Lms, Lmn is output to the video signal output terminal 107. Such operation will be explained after the noise voltage-reading period.

Then, in the former half of the reading period, the output (VPGn) of the VSCAN drive scanning circuit 102 is set to the ground potential (the gate potential of the MOS transistor 112). At the same time, the preset voltage Vmpr (1.6 V (the source potential of the MOS transistor 112)) is stored in the first line memory Lms by closing the first switch circuit CK1 of the signal output circuit 105 and closing a precharge switch circuit CK5. Meanwhile, the VDD supply line 22a is kept at about 3.3 V.

Then, in the latter half of the reading period, the output (VPGn) of the VSCAN drive scanning circuit 102 is set to about 2.2 V (the gate potential of the MOS transistor 112). Meanwhile, the VDD supply line 22a is kept at about 3.3 V (the drain potential of the MOS transistor 112). The precharge switch circuit CK5 is opened at the same time when the output (VPGn) is risen.

More particularly, the gate voltage of about 2 to 3 V, by which the MOS transistor 112 can operate in its saturation state, is applied to the gate electrode 19 and also the voltage of about 2 to 3 V, which enables the operation of the MOS transistor 112, is applied to the drain regions 17a, 17b. Accordingly, the electron accumulated area of the low electric field is formed in a part of the channel region over the carrier pocket 25, while the high electric field region is formed in the remaining area of the channel region.

Then, as shown in FIG. 5A, the first line memory Lms is being charged. Then, the source potential is increased with the progress of the charge, and flow of the drain current is stopped when the source potential becomes equal to the threshold voltage. Accordingly, the charging has been completed, and the threshold voltage (source potential Vouts) that is light-modulated is stored in the first line memory Lms. The voltage due to charges except the light generating charges (i.e., called the noise voltage (Voutn)) in addition to the voltage generated merely by the light generating charges is contained in the threshold voltage.

After the reading period has been finished, the first switch circuit CKI is opened and the precharge switch circuit CK5 keeps opened.

Next, the operation is shifted to the initializing operation. In the initializing operation, the charges which remain in the carrier pocket 25 and the first and second well regions 15a, 15b are discharged. That is, by applying 6.6 V from the stepup scanning circuit 108 to the source of the light signal detecting MOS transistor 112, the potential of the drain is set to 6.6 V via the light signal detecting MOS transistor 112 and also the potential of the gate electrode 19 is set to about 8.6 V via the source-gate capacitance because it has already been harged at 2 V.

At this time, the voltage applied to the gate lectrode 19 is applied to the second well region 15b and the epitaxial layer 12 below the second well region 15b. The carriers can be swept out firmly from the second well region 15b by the electric field generated at this time. In this manner, since the step-up scanning circuit 108 is provided, the carriers can be swept out more firmly by the low power supply voltage.

After the light generating charges accumulated in the high concentration buried layer 25 have been discharged, in the former half of the noise voltage-reading period prior to the storing period, the output (VPGn) of the VSCAN drive scanning circuit 102 is set to the ground potential (the gate potential of the MOS transistor 112) and at the same time the output (Vpdn) of the VDD drive scanning circuit 103 is set to 3.3 V (the drain potential of the MOS transistor 112). Also, the second line memory Lmn is connected to the source region of the insulated gate field effect transistor 112 by closing the precharge switch circuit CK6 and the second switch circuit CK2. Hence, the preset voltage Vmpr (1.6 V (the source potential of the MOS transistor 112)) is stored in the second line memory Lmn.

Then, in the latter half of the noise voltage-reading period, the output (VPGn) of the VSCAN drive scanning circuit 102 is set to about 2.2 V (the gate potential of the MOS transistor 112). Meanwhile, the VDD supply line 22a is kept at about 3.3 V. The precharge switch circuit CK6 is opened at the same time when the output (VPGn) is risen.

As a result, the electron accumulated area of the low electric field is formed in a part of the channel region over the carrier pocket 25, while the high electric field area is formed in the remaining portion of the channel region. At this time, the drain current is flown into the source of the MOS transistor 112. Therefore, as shown in FIG. 5B, the second line memory Lmn is charged gradually. The source potential is increased with the progress of the charge, and flow of the drain current is stopped when the source potential becomes equal to the threshold voltage. As a result, the charging has been completed, and the noise voltage (VoutN) due to not the light generating charges but the residual charges is stored in the second line memory Lmn.

After the noise voltage-reading period has been finished, the second switch circuit CK2 is opened and the precharge switch circuit CK6 keeps opened.

Then, the operation is returned to the storing period. At this time, the storing operation is carried out, and also an operation for outputting the difference voltage between the source potentials VoutS, VoutN stored in the line memories Lms, Lmn is carried out. The operation for outputting the source potential will be explained in the following.

More particularly, the source potentials VoutS, VoutN stored in the line memories Lms, Lmn are input into the negative input terminal and the positive input terminal of the first operational amplifier 31 respectively by closing the third switch circuit CK3 and the fourth switch circuit CK4. At this time, both the reset switch circuits RSTs and RSTn are opened. As a result, the charges in the line memories Lms, Lmn are moved to respective feedback capacitors Cfs, Cfn, and also −VoutS, −VoutN are output to the positive and negative output terminals of the first operational amplifier 31 respectively.

These −VoutS, −VoutN are input into the negative output terminal and the positive terminal of the second operational amplifier 32 respectively, and then the difference voltage (VoutS−VoutN) between VoutS and VoutN is output from the output terminal of the second operational amplifier 32.

In this fashion, the video signal (Vout=VoutS−VoutN) which is proportional to an amount of light irradiation can be picked up.

As described above, according to the embodiment of the present invention, since the threshold-modulated type light signal detecting insulated gate field effect transistor 112 in which the high concentration buried layer 25 is provided under the channel and which accumulates the light generating charges under the channel is employed as the light signal detecting insulated gate field effect transistor in the pixel, the channel length is long.

For this reason, since the electric fields from the drain regions 17a, 17b are relaxed, the drain-induced barrier lowering (DIBL) can be suppressed. Hence, since the threshold variation is made small and, in turn variation in the sub-threshold current is made small, the charging current can be minimized. As a result, since potential reduction due to the parasitic resistance such as the wiring, etc. can be suppressed, the direct coupling with the capacitive load can be attained.

Also, a finite time is needed to load line memories Lms, Lmn. But the loading time into the line memories Lms, Lmn is considerably shorter than the noise voltage-reading period and the reading period. Therefore, the loading into the line memories Lms, Lmn can be finished in the noise voltage-reading period, or the like.

By the way, if a plurality of line memories are aligned in parallel, these parasitic capacitances are connected in parallel with the line memories to be read, and the first and second source potentials stored in the line memory to be read are output via the switched capacitor circuit. At this time, since the charge transfer is caused in the switched capacitor circuit by the first operational amplifier 31, the parasitic capacitance viewed from the output side of the switched capacitor circuit can be reduced.

Therefore, a reading speed is seldom affected even if a plurality of line memories are aligned in parallel. Also, such advantage can be achieved that, since the influence of the parasitic capacitance is small, the maximum gain can be obtained.

Also, the carriers can be swept out surely by the low power supply voltage by connecting a step-up circuit 108 to the source region of the light signal detecting MOS transistor 112.

In addition, an ideal photoelectric converting mechanism can be implemented in which the light generating holes do not interact with the noise source on the surface of the semiconductor and in the channel region when such light generating holes are moved in a series of processes of the storing operation-the reading operation-the sweeping-out operation (initializing operation).

(Second Embodiment)

The second embodiment of the present invention will be explained with reference to FIG. 6, FIG. 7, FIG. 8, FIG. 9A and FIG. 9B hereunder.

The layout of the unit pixel according to the second embodiment is same as the first embodiment. Details of the above signal output circuit 105 according to the second embodiment are shown in FIG. 6 and FIG. 7.

It is different from the first embodiment that a single high voltage blocking switch circuit CK7 is provided on the vertical output line 20a between the first switch circuit CK1 and the second switch circuit CK2 and the source region. The second embodiment is effective particularly in case that transmission gates composed of CMOS transistors including a p-channel MOS transistor are used as the first switch circuit CK1 and the second switch circuit CK2, respectively.

The reason why the transmission gates are used as switch circuits CK1 and CK2 is to pass a higher signal voltage without distortion through the switch circuits. Further, it is preferred to use a depletion type n-channel MOS transistor having lower threshold voltage as the switches CK3 through CK7 in accordance with using the transmission gates.

Figure 6:
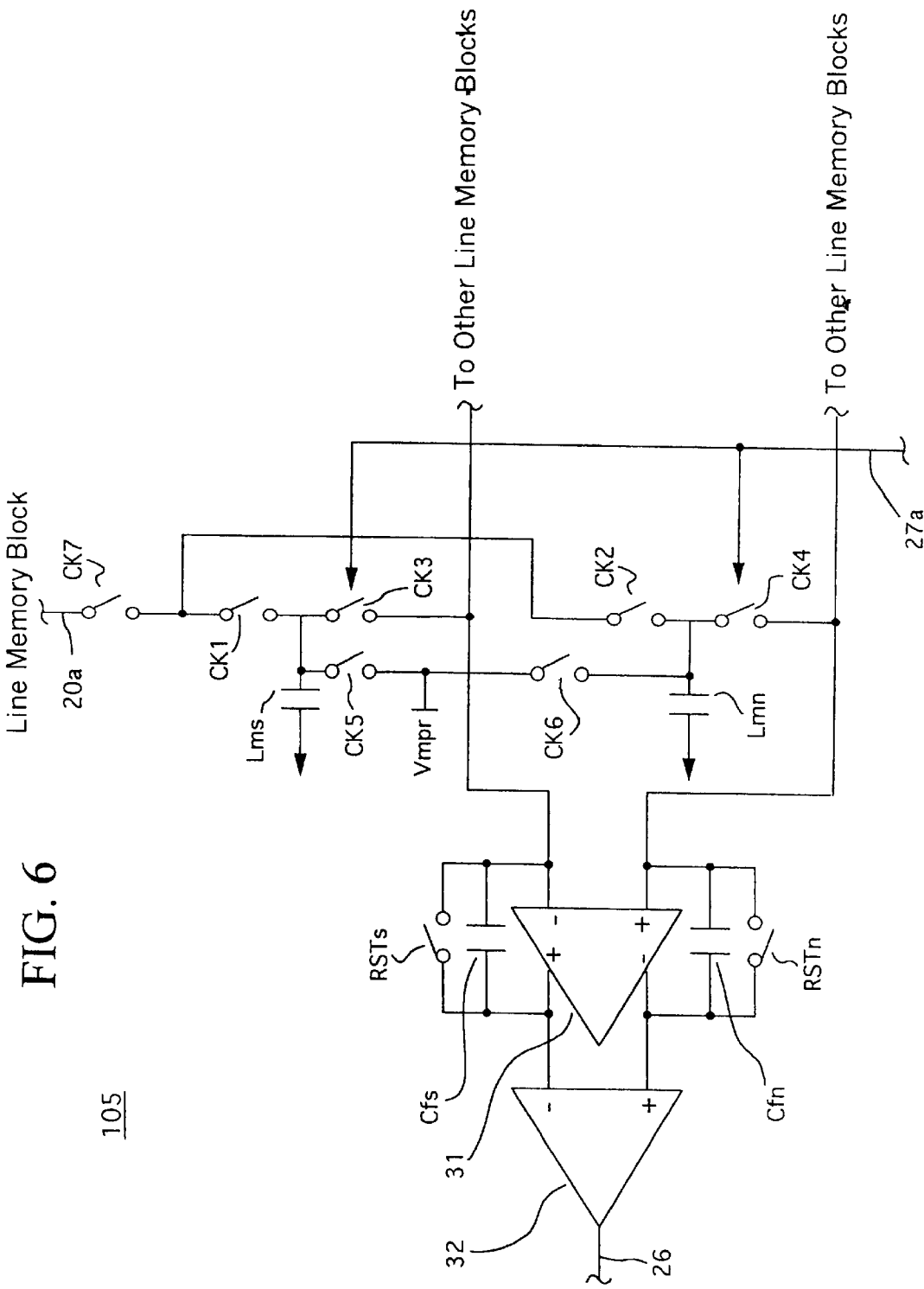
FIG. 6 is a view showing a detailed configuration of a signal output circuit of the solid state imaging device in FIG. 2 according to a second embodiment of the present invention.
Figure 7:
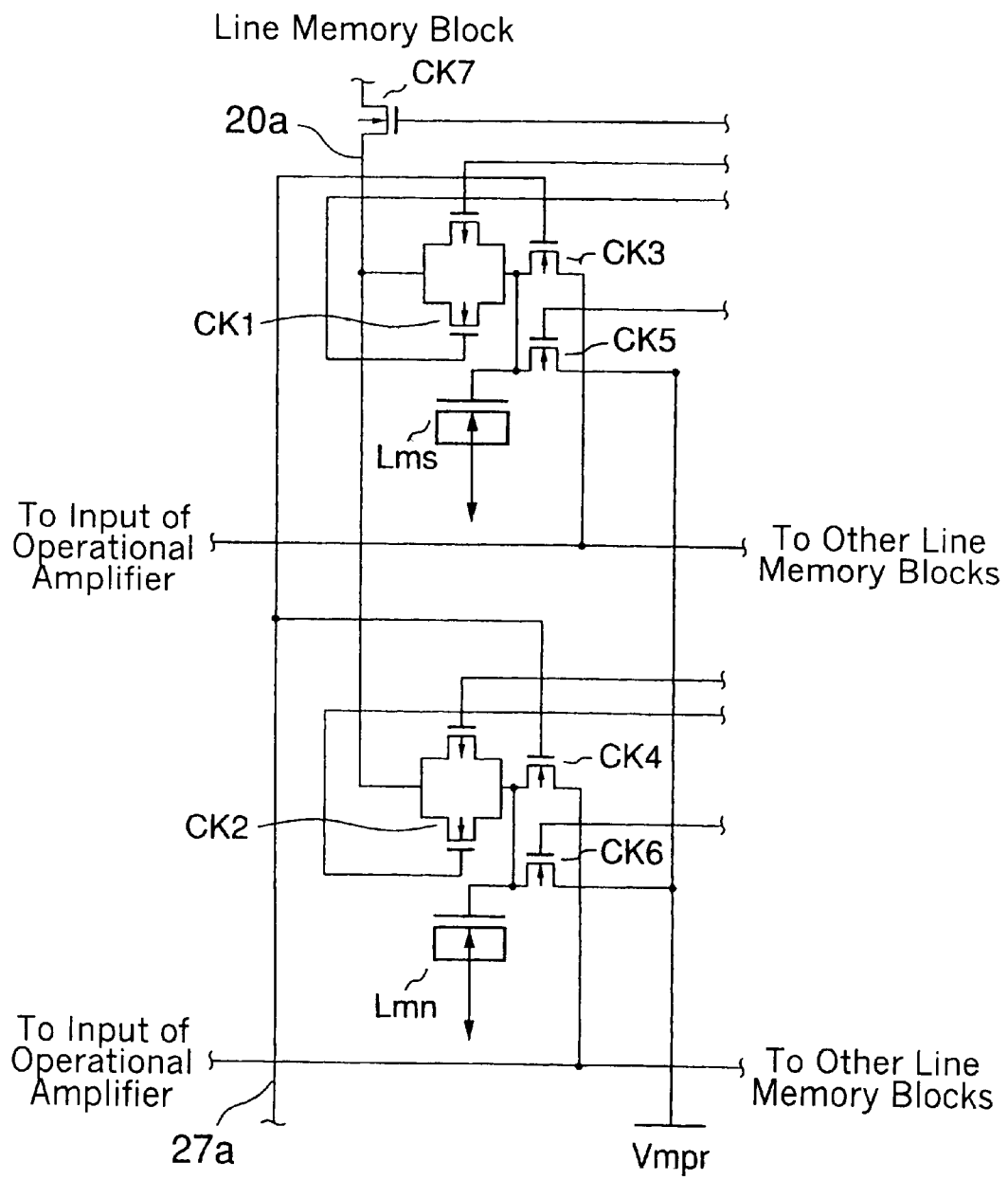
FIG. 7 is a view showing a detailed configuration of a part of the line memories of a signal output circuit in FIG. 6.
Figure 8:
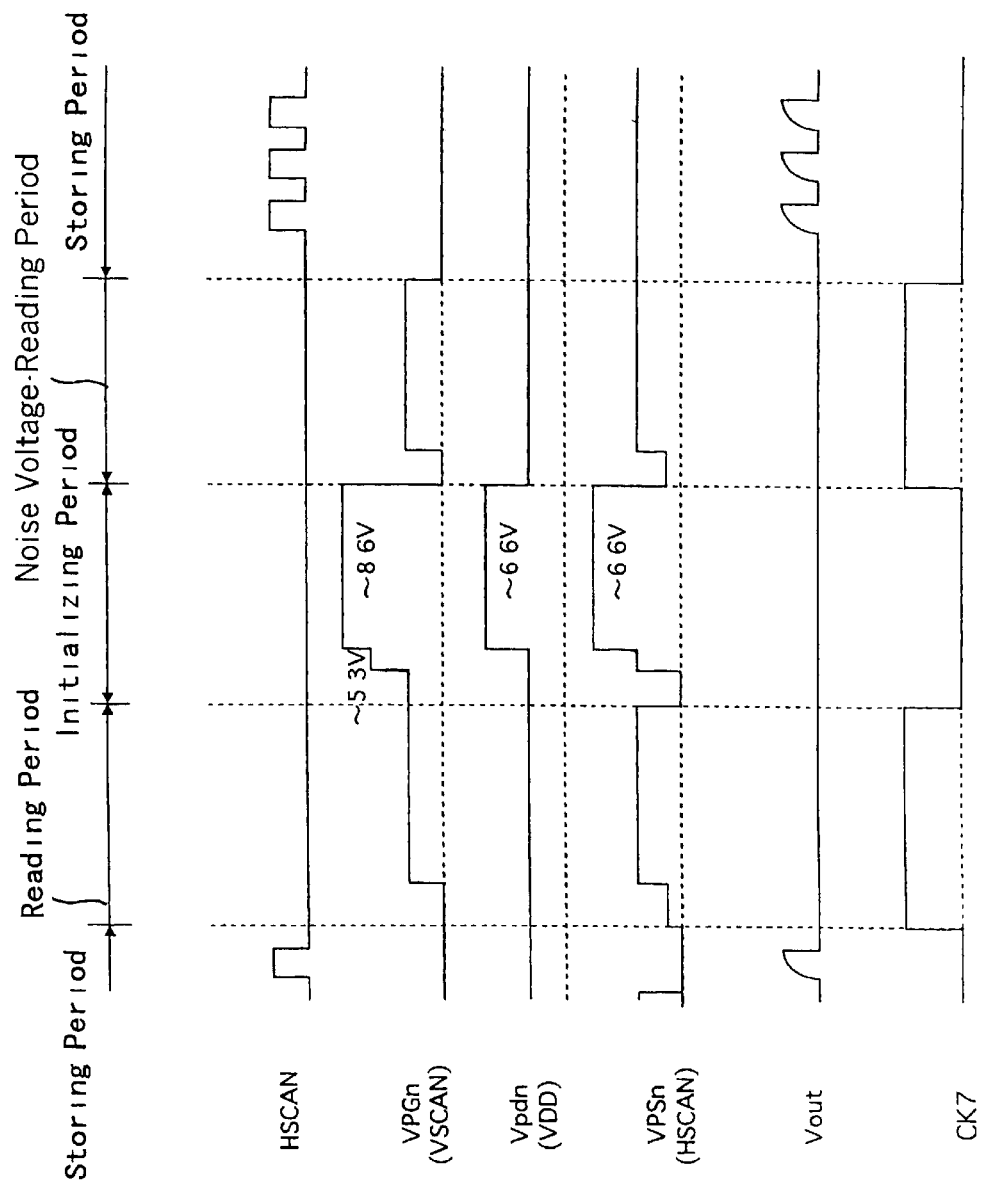
FIG. 8 is a timing chart in operating the solid state imaging device in FIG. 2 and FIG. 6.
Figure 9A:
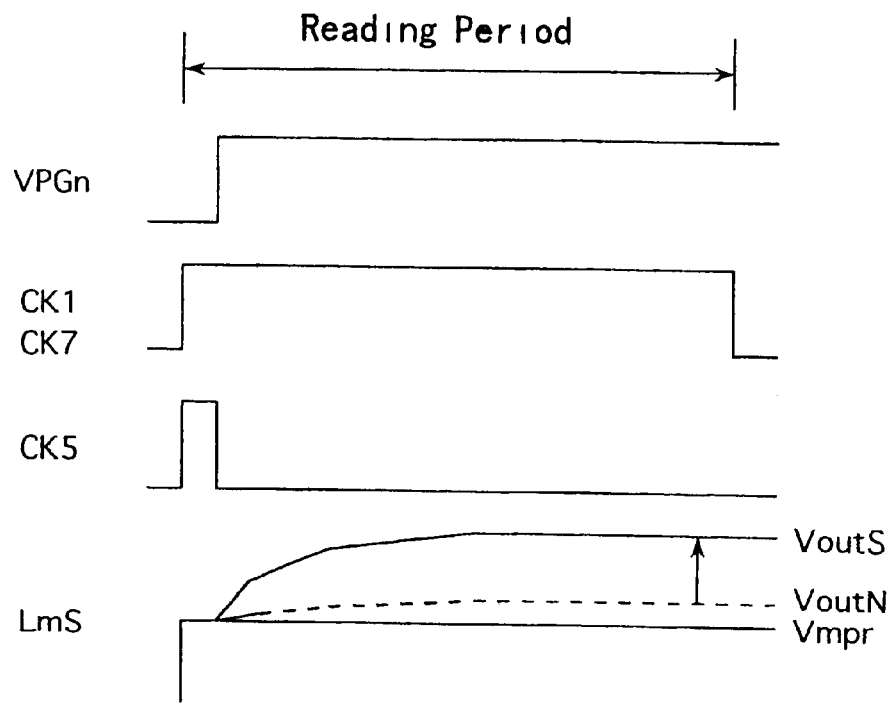
FIG. 9A is a timing chart in the reading period in operating the solid state imaging device in FIG. 7.
Figure 9B:
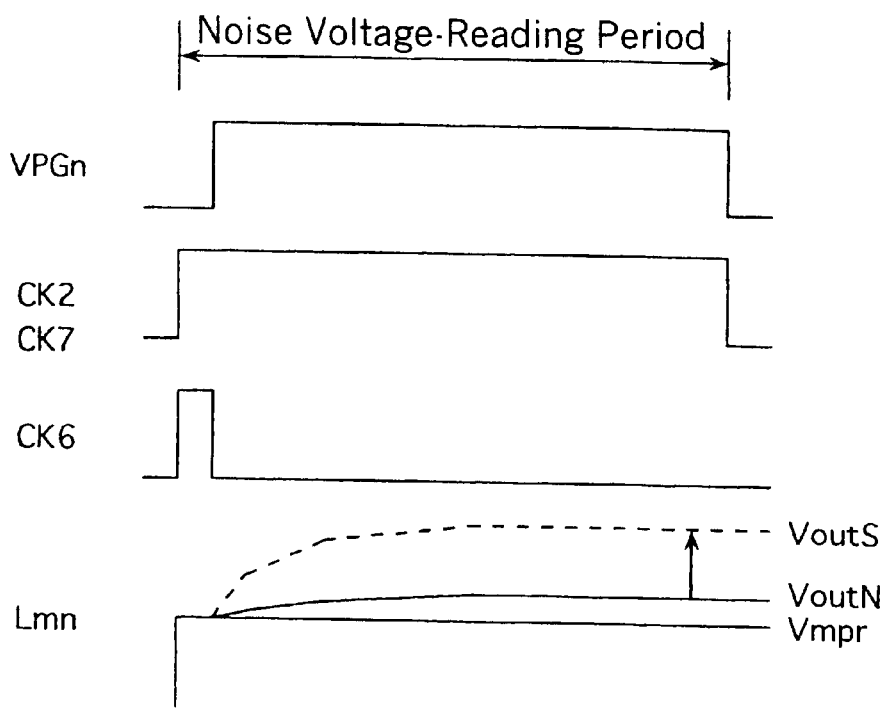
FIG. 9B is a timing chart in the noise voltage-reading period.

Next, an operation method of the signal output circuit 105 shown in FIG. 6 and FIG. 7 is explained with reference to FIG. 8, FIG. 9A and FIG. 9B. Since the operation method other than the following explanation is same as the first embodiment, it is omitted.

In the former half and the latter half of the reading period, the high voltage blocking switch circuit CK7 is closed to connect the path between the first switch circuit CK1 and the source region, and the second switch circuit CK2 is opened to disconnect the path between the second line memory Lmn and the source region.

After the reading period has been finished, while the high voltage blocking switch circuit CK7 and the first switch circuit CK1 are opened and the precharge switch circuit CK5 keeps opened.

In the initializing period, the high voltage blocking switch circuit CK7 is opened to disconnect the path between the first switch circuit CK1 and the; source region and the path between the second switch circuit CK2 and the source region. Thus, higher voltages are not applied to the source/drain regions of p-channel MOS transistors of the transmission gates constituting the first switch circuit CK1 and the second switch circuit CK2, therefore, wrong operations thereof are prevented.

After the light generating charges accumulated in the high concentration buried layer 25 have been discharged, in the former half of the noise voltage-reading period prior to the storing period, the high voltage blocking switch circuit CK7 is closed to connect the path between the second switch circuit CK2 and the source region, and the first switch circuit CK1 is opened to disconnect the path between the first line memory Lms and the source region.

Then, in the latter half of the noise voltage-reading period, the high voltage blocking switch circuit CK7 keep closed to connect the path between the second switch circuit CK2 and the source region, and the first switch circuit CK1 keep opened to disconnect the path between the first line memory Lmn and the source region.

As described above, according to the second embodiment of the present invention, the high voltage blocking switch circuit CK7 is provided on the vertical output line 20a between the first and second switch circuits and the source region of the light signal detecting insulated gate field effect transistor. Accordingly, even if the transmission gates composed of CMOS transistors are used as switch circuits CK1 and CK2, the wrong operation can be prevented by cutting the connections between the first switch circuit and the source region and between the second switch circuit and the source region during the initializing period when a high voltage is applied to the source region in, order to sweep out the charges stored in the high concentration buried layer.

(Third Embodiment)

Figure 10:
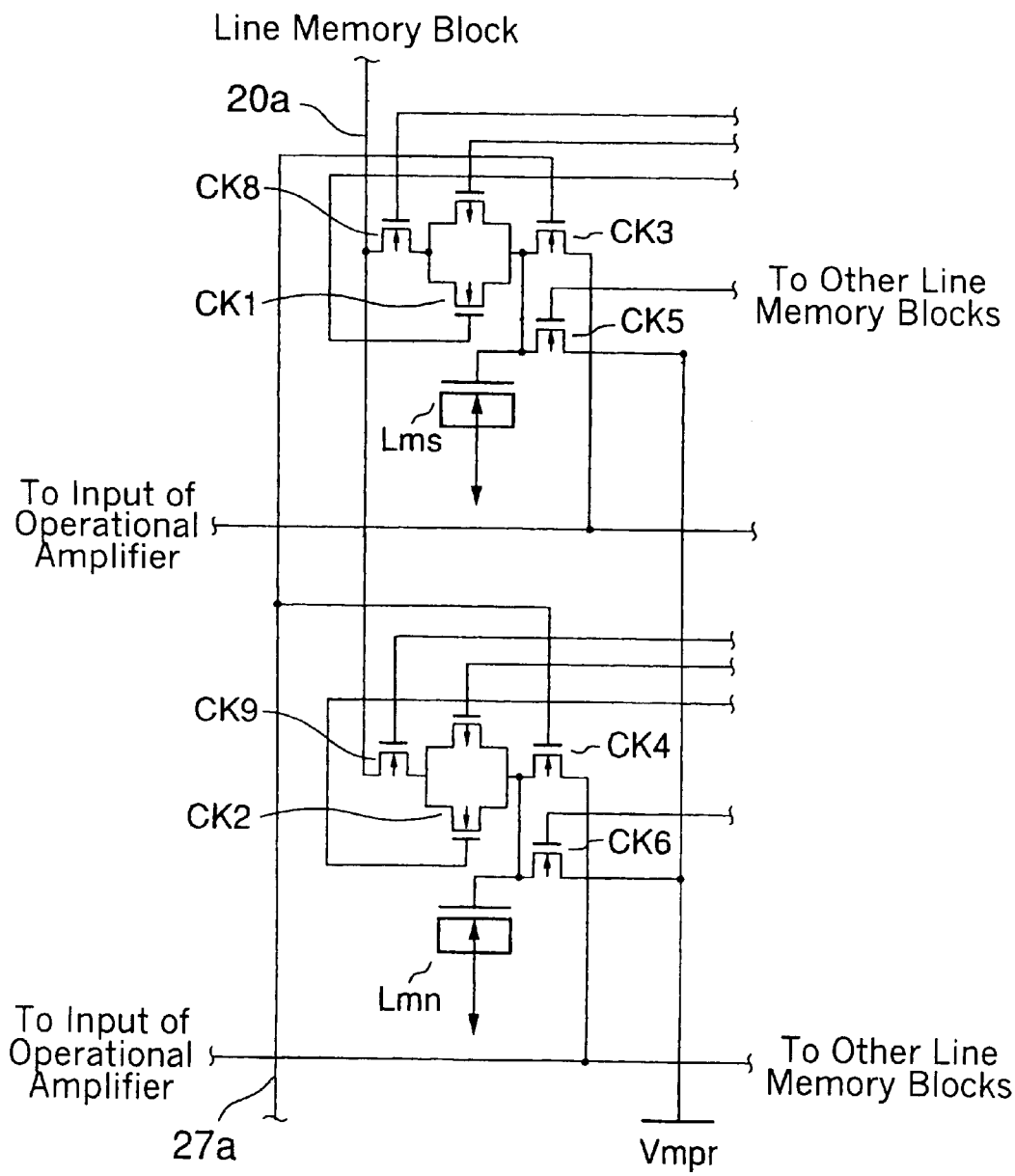
FIG. 10 is a view showing a detailed configuration of a part of the line memories of a signal output circuit according to a third embodiment of the present invention.

The third embodiment of the present invention will be explained with reference to FIG. 10 and FIG. 11 hereunder.

In the second embodiment, as shown in FIG. 6 and FIG. 7, the high voltage blocking switch circuit CK7 is provided on the vertical output line 20a before a branch point branching to the first line memory Lms and to the second line memory Lmn. However, as shown in FIG. 10, the first and second high voltage blocking switch circuits CK8 and CK9 may be provided on the branch lines branching to the first line memory Lms and to the second line memory Lmn from the vertical output line 20a, respectively.

Figure 11A:
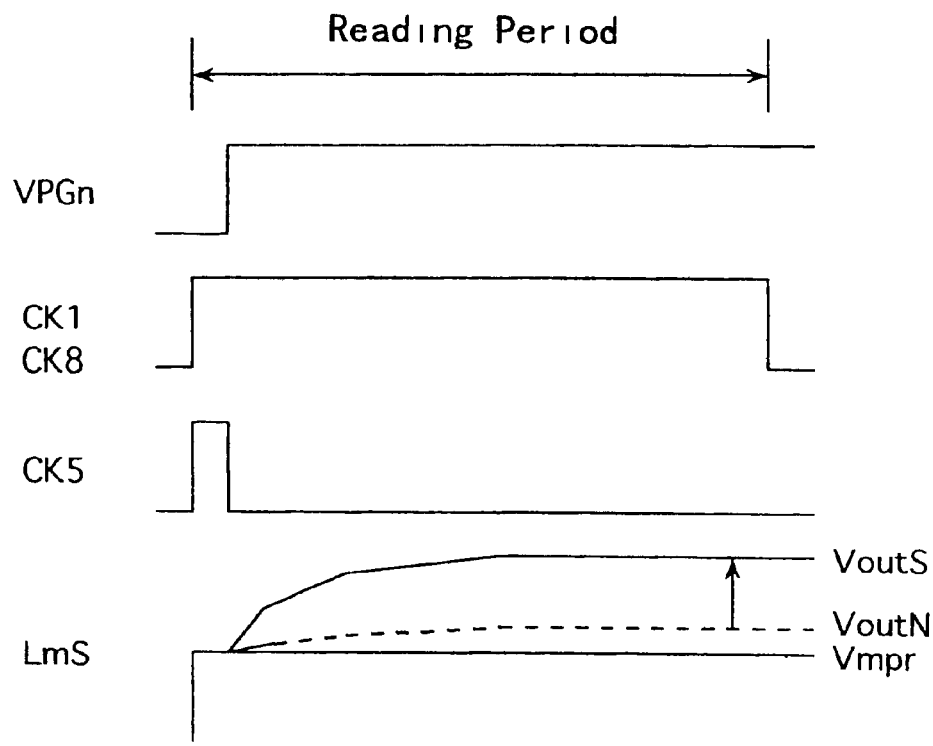
FIG. 11A is a timing chart in the reading period in operating the solid state imaging device in FIG. 10.
Figure 11B:
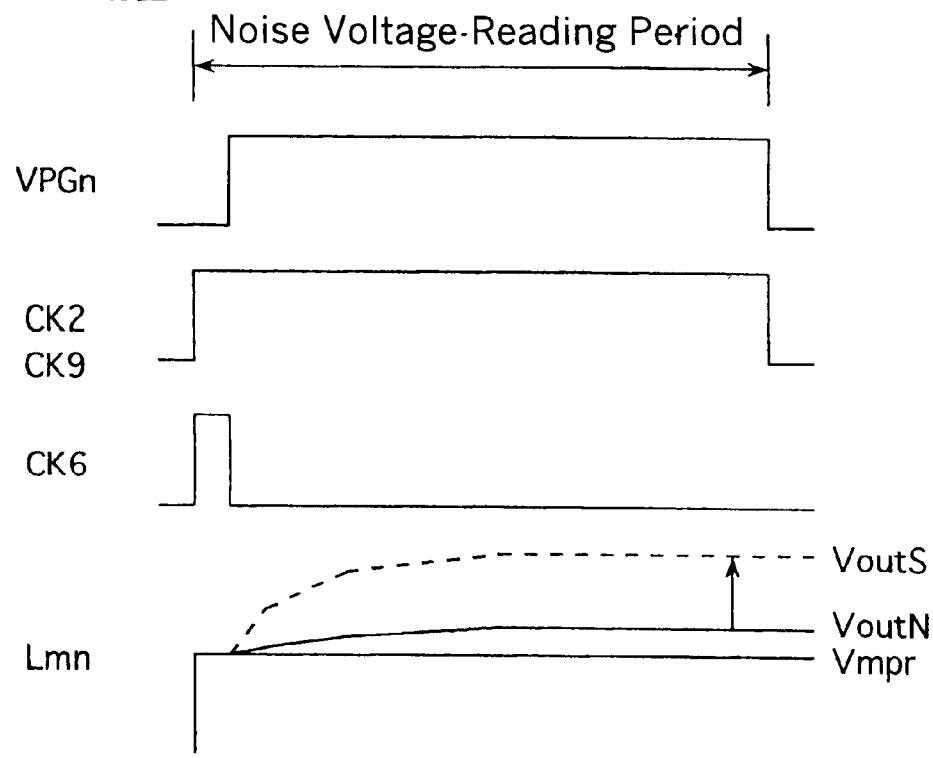
FIG. 11B is a timing chart in the noise voltage-reading period.

In this case, an operation method is shown in FIG. 11. In another word, in the reading period, the first high voltage blocking switch circuit CK8 is closed to connect the first line memory Lms and the source region, and in the noise voltage-reading period, the second high voltage blocking switch circuit CK9 is closed to connect the second line memory Lmn and the source region. In the initializing period, both the first and second high voltage blocking switch circuits CK8 and CK9 are opened to disconnect the path between the first line memory Lms and the source region and the path between the second line memory Lmn and the source region.

With the above, the present invention has been explained in detail according to the embodiment. However, the scope of the present invention is not limited to the examples described particularly in the above embodiment, and various modifications of the above embodiment may be contained in the scope of the present invention without departing from the gist thereof.

For example, in the above embodiment, the first and second well regions 15a, 15b are formed in the n-type epitaxial layer 12 on the p-type substrate 11. In this case, the n-type well layer may be formed by introducing the n-type impurity into the p-type epitaxial layer in place of the n-type epitaxial layer 12, and then the first and second well regions 15a, 15b may be formed in this n-type well layer.

In addition, various modification may be considered as the structure of the solid state imaging device to which the present invention is applied. If the photo diode and the light signal detecting MOS transistor may be positioned adjacently to constitute the unit pixel and the high concentration buried layer (carrier pocket) may be provided in the p-type well region under the channel region of the MOS transistor and in vicinity of the source region, any structure may be employed regardless of other structures.

Further, the p-type substrate 11 has been employed, but the n-type substrate may be employed alternatively. In this case, in order to achieve the similar advantage to the above embodiment, all conductivity types of respective layers and respective regions explained in the above embodiment, etc. may be inverted. In this case, the carriers to be accumulated in the carrier pocket 25 are the electrons out of the electrons and the holes.

What is claimed is:

1. A solid state imaging device comprising:

a solid state imaging element including unit pixels each having a photo diode and a light signal detecting insulated gate field effect transistor arranged adjacently to the photo diode, the insulated gate field effect transistor having a high concentration buried layer provided in a well region under a gate electrode in vicinity of a source region to store light generating charges by irradiating a light to the photo diode, the solid state imaging element storing the light generating charges in the high concentration buried layer to modulate a threshold voltage and detect a light signal;

a vertical scanning signal driving scanning circuit for outputting a scanning signal to a gate electrode of the light signal detecting insulated gate field effect transistor; and a signal output circuit for inputting to a first input terminal a first source potential obtained in a state the light generating charges are stored in the high concentration buried layer, and inputting to a second input terminal a second source potential obtained in a state the light generating charges are swept out from the high concentration buried layer, and then outputting a voltage in correspondence with the input first and second source potentials;

wherein the signal output circuit comprises a first switched capacitor circuit which has a first memory (Lms) and a first operational amplifier circuit, a second switched capacitor circuit which has a second memory (Lmn) and a second operational amplifier circuit, and a third operational amplifier circuit, and the first source potential is stored in the first memory (Lms) and then transmitted via the first operational amplifier circuit to the third operational amplifier circuit, and the second source potential is stored in the second memory (Lmn)

and then transmitted via the second operational amplifier circuit to the third operational amplifier circuit, and then the difference voltage between the first and second source potentials is output from the third operational amplifier circuit.

2. A solid state imaging device according to claim 1, wherein the first operational amplifier circuit and the second operational amplifier circuit thereof are integrated into an integrated operational amplifier circuit, and the integrated operational amplifier circuit has positive and negative input terminals and positive and negative output terminals, and has a feedback capacitor (Cfs) connected between the negative input terminal and the positive output terminal and a feedback capacitor (Cfn) connected between the positive input terminal and the negative output terminal, and the third operational amplifier circuit has positive and negative input terminals and an output terminal, and the first source potential output from the first memory is transmitted to the negative input terminal of the third operational amplifier circuit via the negative input terminal of the integrated operational amplifier circuit and the positive output terminal thereof, and the second source potential output from the second memory is transmitted to the positive input terminal of the third operational amplifier circuit via the positive input terminal of the integrated amplifier circuit and the negative output terminal thereof, and the difference voltage between the first and second source potentials is output from the output terminal of the third operational amplifier circuit.

3. A solid state imaging device according to claim 2, further comprising:
   a first switch circuit provided between the source region of the light signal detecting insulated gate field effect transistor and the first memory;
   a second switch circuit provided between the source region of the light signal detecting insulated gate field effect transistor and the second memory;
   a third switch circuit provided between the first memory and the negative input terminal of the integrated operational amplifier; and
   a fourth switch circuit provided between the second memory and the positive input terminal of the integrated operational amplifier.

4. A solid state imaging device according to claim 3, wherein the source region of the light signal detecting insulated gate field effect transistor is directly connected to the first memory through the first switch circuit and directly connected to the second memory through the second switch circuit.

5. A solid state imaging device according to claim 1, wherein a means for applying a preset voltage is connected to the first memory and the second memory, respectively.

6. A solid state imaging device according to claim 2, further comprising:
   a drain voltage driving scanning circuit connected to the drain region of the insulated gate field effect transistor via a drain voltage supply line;
   a horizontal scanning signal input scanning circuit, for supplying a signal to control open/close of the third switch circuit and the fourth switch circuit of the signal output circuit; and
   a video signal output terminal connected to the output terminal of the third operational amplifier of the signal output circuit.

7. A solid state imaging device according to claim 1, wherein a neighboring area of the source region, in which the high concentration buried layer is formed, is a partial area in a channel length direction from the drain region to the source region and located on a source region side.

8. A solid state imaging device according to claim 1, wherein the high concentration buried layer is formed in an overall area in a channel width direction.

9. A solid state imaging device according to claim 1, wherein the gate electrode of the insulated gate field effect transistor has a ring-like shape, the source region is formed on a surface layer of the well region surrounded by the gate electrode, the drain region is formed on a surface layer of the well region to surround the gate electrode.

10. A solid state imaging device according to claim 1, wherein a gate electrode and its peripheral area of the insulated gate field effect transistor is light-shielded.

11. A solid state imaging device comprising:
   a solid state imaging element including unit pixels each having a photo diode and a light signal detecting insulated gate field effect transistor arranged adjacently to the photo diode, the insulated gate field effect transistor having a high concentration buried layer provided in a well region under a gate electrode in vicinity of a source region to store light generating charges by irradiating a light to the photo diode, the solid state imaging element storing the light generating charges in the high concentration buried layer to modulate a threshold voltage and detect a light signal;
   a vertical scanning signal driving scanning circuit for outputting a scanning signal to a gate electrode of the light signal detecting insulated gate field effect transistor;
   a high voltage supply circuit supplying a voltage for sweeping out the light generating charges stored in the high concentration buried layer to the source region of the light signal detecting insulated gate field effect transistor; and
   a signal output circuit for inputting to a first input terminal a first source potential obtained in a state the light generating charges are stored in the high concentration buried layer, and inputting to a second input terminal a second source potential obtained in a state the light generating charges are swept out from the high concentration buried layer, and then outputting a voltage in correspondence with the input first and second source potentials;
   wherein the signal output circuit provides in a previous portion thereof with a high voltage blocking switch circuit for preventing an input of a high voltage from the high voltage supply circuit.

12. A solid state imaging device according to claim 11, further comprising:
   a first switched capacitor circuit which has a first memory (Lms), a first switch circuit, a third switch circuit, and a first operational amplifier circuit;
   a second switched capacitor circuit which has a second memory (Lmn), a second switch circuit, a fourth switch circuit, and a second operational amplifier circuit; and
   a third operational amplifier circuit;
   wherein the first source potential is stored in the first memory (Lms) and then transmitted via the first operational amplifier circuit to the third operational amplifier circuit, and the second source potential is stored in the second memory (Lmn) and then transmitted via the second operational amplifier circuit to the third operational amplifier circuit, and the difference voltage between the first and second source potentials is output from the third operational amplifier circuit.

13. A solid state imaging device according to claim 12, wherein the source region of the light signal detecting insulated gate field effect transistor is directly connected to the first memory through the high voltage blocking switch circuit and the first switch circuit, and directly connected to the second memory through the high voltage blocking switch circuit and the second switch circuit.

14. A solid state imaging device according to claim 12, wherein the first and second switched capacitor circuits are integrated into an integrated switched capacitor circuit, and the integrated operational amplifier circuit has a positive and negative input terminals and a positive and negative output terminals, a feedback capacitor (Cfs) is connected between the negative input terminal and the positive output terminal, a feedback capacitor (Cfn) is connected between the positive input terminal and the negative output terminal, the third operational amplifier has positive and negative input terminals and an output terminal, the positive and negative output terminals of the integrated operational amplifier circuit are connected to the negative and positive input terminals of the third operational amplifier circuit, respectively, and the first source potential is transmitted selectively by the first switch circuit and then stored in the first memory (Lms), and then input selectively by the third switch circuit to the negative input terminal of the integrated operational amplifier from the first memory (Lms), and the second source potential is transmitted selectively by the second switch circuit and then stored in the second memory (Lmn), and then input selectively by the fourth switch circuit to the positive input terminal of the integrated operational amplifier circuit from the second memory (Lmn), and then the first source potential is input to the negative input terminal of the third operational amplifier circuit from the positive output terminal of the integrated operational amplifier circuit, and the second source potential is input to the positive input terminal of the third operational amplifier circuit from the negative output terminal of the integrated operational amplifier.

15. A solid state imaging device according to claim 12, wherein the first switch circuit and the second switch circuit are transmission gates comprising CMOS transistors, respectively.

16. A solid state imaging device according to claim 12, wherein an input of the first switch circuit and an input of the second switch circuit are connected, and the high voltage blocking switch circuit is provided between the connected point and the source region.

17. A solid state imaging device according to claim 12, wherein the high voltage blocking switch circuit comprises a first high voltage blocking switch circuit provided between the first switch circuit and the source region, and a second high voltage blocking switch circuit provided between the second switch circuit and the source region.

18. A solid state imaging device according to claim 11, wherein the high voltage blocking switch circuit is a depletion type MOS transistors having a lower threshold voltage.

19. A solid state imaging device driving method of reading a light signal by repeating a storing period in which light generating charges generated by irradiating a light to a photo diode are stored in a high concentration buried layer, a reading period in which the light signal based on the light generating charges stored in the high concentration buried layer is read, and an initializing period in which the light generating charges remaining in the high concentration buried layer are discharged in this sequence, by using a solid state imaging device including a solid state imaging element including unit pixels each having a photo diode and a light signal detecting insulated gate field effect transistor arranged adjacently to the photo diode, the insulated gate field effect transistor having a high concentration buried layer provided in a well region under a gate electrode in vicinity of a source region to store light generating charges by irradiating a light to the photo diode, the solid state imaging element storing the light generating charges in the high concentration buried layer to modulate a threshold voltage and detect a light signal, the method comprising the steps of:

in the reading period, storing a first source potential into a first memory connected to the source region of the insulated gate field effect transistor;

then in the initializing period, discharging the light generating charges stored in the high concentration buried layer;

then storing a second source potential into a second memory connected to the source region of the insulated gate field effect transistor prior to the storing period; and in the storing period, reading the first source potential and the second source potential stored in the first memory and the second memory, and then outputting a difference voltage between the first source potential and the second source potential via switched capacitor circuits.

20. A solid state imaging device driving method according to claim 19, wherein in the initializing period, the light generating charges stored in the high concentration buried layer are discharged applying a high voltage to the source region while a path between the first memory and the source region and a path between the second memory and the source region are disconnected.

21. A solid state imaging device driving method of reading a light signal by repeating a storing period in which light generating charges generated by irradiating a light to a photo diode are stored in a high concentration buried layer, a reading period in which the light signal based on the light generating charges stored in the high concentration buried layer is read, and an initializing period in which the light generating charges remaining in the high concentration buried layer are discharged in this sequence, by using a solid state imaging device including a solid state imaging element including unit pixels each having a photo diode and a light signal detecting insulated gate field effect transistor arranged adjacently to the photo diode, the insulated gate field effect transistor having a high concentration buried layer provided in a well region under a gate electrode in vicinity of a source region to store light generating charges by irradiating a light to the photo diode, the solid state imaging element storing the light generating charges in the high concentration buried layer to modulate a threshold voltage and detect a light signal, the method comprising the steps of:

in the reading period, storing a preset voltage into a first memory connected to the source region of the insulated gate field effect transistor, and then storing a first source potential into the first memory;

then in the initializing period, discharging the light generating charges stored in the high concentration buried layer;

then storing a preset voltage into a second memory connected to the source region of the insulated gate field effect transistor prior to the storing period, and then storing a second source potential into the second memory; and in the storing period, reading the first source potential and the second source potential stored in the first memory and the second memory, and then outputting a difference voltage between the first source potential and the second source potential via switched capacitor circuits.

22. A solid state imaging device driving method according to claim 21, wherein in the initializing period, the light generating charges stored in the high concentration buried layer are discharged applying a high voltage to the source region while a path between the first memory and the source region and a path between the second memory and the source region are disconnected.

23. A solid state imaging device comprising:

a pixel area having a photo diode generating light generating charges and a light signal detecting insulated gate field effect transistor arranged adjacently to the photo diode, the insulated gate field effect transistor having a source region, a drain region, a channel region between the source region and drain region, and a high concentration buried layer provided below the channel region and around the source region, the insulated gate field effect transistor being modulated at a threshold voltage by the light generating charges stored in the high concentration buried layer and outputting a source potential in correspondence with the threshold voltage;

a signal output circuit having a memory consisting of a capacitor storing the source potential, and an operational amplifier circuit inputting the source potential from the memory and outputting a video signal in correspondence with the source potentials;

wherein the source region is directly connected to the capacitor of the memory circuit.

24. A solid state imaging device according to claim 23 further comprising a switch circuit connecting or disconnecting a path between the capacitor of the memory and the source region of the insulated gate field effect transistor.

* * * * *

UNITED STATES PATENT AND TRADEMARK OFFICE
CERTIFICATE OF CORRECTION

PATENT NO. : 6,423,958 B1
DATED : July 23, 2002
INVENTOR(S) : Okamoto et al.

It is certified that error appears in the above-identified patent and that said Letters Patent is hereby corrected as shown below:

Column 8,
Line 6, "lms" should read -- Lms --.

Column 10,
Line 55, "harged" should read -- charged --; and
Line 56, "lectrode" should read -- electrode --.

Column 15,
Lined 10, "input." should read -- input --.

Signed and Sealed this

Twenty-fifth Day of March, 2003

JAMES E. ROGAN
*Director of the United States Patent and Trademark Office*